United States Patent [19]
Alinikula et al.

[11] Patent Number: 6,115,593
[45] Date of Patent: Sep. 5, 2000

[54] ELIMINATION OF D.C. OFFSET AND SPURIOUS AM SUPPRESSION IN A DIRECT CONVERSION RECEIVER

[75] Inventors: Petteri Alinikula, Helsinki; Hans-Otto Scheck, Espoo; Kari-Pekka Estola, Helsinki, all of Finland

[73] Assignee: Nokia Mobile Phones, Ltd., Espoo, Finland

[21] Appl. No.: 08/851,530

[22] Filed: May 5, 1997

[30] Foreign Application Priority Data

May 7, 1996 [FI] Finland ..................................... 961935

[51] Int. Cl.[7] ............................... H04B 1/26; H03K 9/00; H04L 25/06
[52] U.S. Cl. ........................... 455/324; 455/283; 375/319; 375/316
[58] Field of Search ..................................... 455/283, 293, 455/324, 295, 296, 309, 308, 312, 337; 375/319, 316, 285, 346

[56] References Cited

U.S. PATENT DOCUMENTS

| | | |
|---|---|---|
| 4,944,025 | 7/1990 | Gehring et al. ........................... 455/207 |
| 5,140,699 | 8/1992 | Kozak ......................................... 455/84 |
| 5,212,826 | 5/1993 | Rabe et al. ............................... 455/214 |
| 5,263,194 | 11/1993 | Ragan ..................................... 455/316 |
| 5,724,653 | 3/1998 | Baker et al. ............................. 455/296 |
| 5,838,735 | 11/1998 | Khullar ..................................... 375/319 |

FOREIGN PATENT DOCUMENTS

| | | |
|---|---|---|
| 0594894 A1 | 5/1994 | European Pat. Off. . |
| 0595278 A1 | 5/1994 | European Pat. Off. . |
| 2274759 | 8/1994 | United Kingdom . |
| WO 95/30275 | 11/1995 | WIPO . |

*Primary Examiner*—Wellington Chin
*Assistant Examiner*—Sheila Smith
*Attorney, Agent, or Firm*—Perman & Green, LLP

[57] ABSTRACT

In a method for compensating D.C. offset in a direct conversion receiver by a signal ($IF\_I$, $IF\_Q$) received and demodulated in one of the channels of the reception frequency band of a radio communication system, a correction signal ($Q_{control}$) is produced from the signals in the channels of the reception frequency band. The correction signal ($Q_{control}$) is combined with the demodulated signal. The apparatus for implementing the method comprises means (12, 17, 18, 19) for producing the correction signal, and means (15, 16) for combining the correction signal with the received and demodulated signal.

15 Claims, 6 Drawing Sheets

ELIMINATION OF D.C. OFFSET AND SPURIOUS AM SUPPRESSION IN A DIRECT CONVERSION RECEIVER

BACKGROUND OF THE INVENTION

The present invention relates to a method presented in the preamble of claim 1 and to an apparatus presented in the preamble of claim 10 for eliminating D.C. offset and achieving AM suppression in a direct conversion receiver.

In a direct conversion receiver, radio frequency signals are converted directly into baseband signals, whereby separate intermediate frequency stages are not required. In that case, the number of high frequency components needed in direct conversion receivers is smaller than in conventional receivers which include intermediate frequency stages. Due to less complexity, the integration degree of direct conversion receivers can be increased compared to receivers which include intermediate frequency stages.

However, receivers implemented with the direct conversion technique have the problem that their dynamic range is smaller than in receivers which include intermediate frequency stages. The dynamic range is adversely affected by the fact that in addition to the high frequency signal of the reception channel, the mixer of the receiver also receives high frequency signals of the adjacent channels, whereby due to the non-ideality of the mixer, a disturbing D.C. offset is produced on the output of the mixer. Thus the stronger signals of the adjacent channels can produce a substantially higher D.C. offset in the signal than the desired signal expressed on the reception channel.

In a digital receiver, the decision on whether the transmitted symbol is 0 or 1 is made on the basis of the voltage level of the demodulated signal. Thus the D.C. offset can cause a wrong decision to be made in the receiver concerning the transmitted symbol. In an I/Q-modulated signal, two consecutive symbols are combined into I and Q signals.

Thus I and Q signals are produced from the received signal in the I/Q demodulator, on the basis of which a decision is made in the receiver as to which symbol pair (00, 01, 10, 11) has been transmitted. The D.C. offset can occur in both I and Q signals, whereby a wrong decision can be made in the receiver as to the signal pair transmitted. In the worst case, even the error correction logic of the receiver cannot correct the information that has got a faulty expression.

There are some prior art solutions, in which an attempt is made to express the signal of the reception channel in spite of a high interfering D.C. offset. However, a drawback of these solutions is the fact that they only operate in situations in which the disturbing D.C. offset is constant or changes very slowly. In situations in which the powers of the signals in the adjacent channels vary quickly, the disturbing D.C. offset also changes quickly, whereby the prior art solutions are not capable of fully eliminating the disturbance caused by the D.C. offset. This is a typical situation in TDMA systems, for example.

The published solutions to eliminate the problem caused by the D.C. offset are mainly based on various DC filter applications. When a narrowband filter is used, the settling time becomes long, whereby the filter cannot react to quick changes of power. On the other hand, with a wideband filter it is possible to achieve a short settling time, but a filter of this kind also filters a substantial part of the useful signal, whereby the performance of the receiver is reduced.

The U.S. Pat. No. 5,212,826 presents a method for eliminating the D.C. offset in a manner such that, during the delay period of the receiver, the HF signal is prevented from entering the receiver, and the D.C. offset thus appearing in the receiver is measured. On the basis of the measurement, a constant correction voltage is produced and fed into the correction circuit of the receiver during the reception stage. A new measurement is performed during the next delay period, and a correction voltage corresponding to the new measured value is fed to the correction circuit during reception. A drawback of this method is, for example, the fact that the correction voltage is constant during the whole reception phase, and a HF signal is not fed to the receiver during the measurement, whereby the D.C. offset caused by the HF signal cannot be eliminated.

The British patent application GB 2 274 759 presents a method in which the D.C. offset is assessed by filtering from the demodulated baseband signal. This method can be applied primarily in cases in which the change of the offset voltage is substantially slower than the bit rate of the received signal.

In the prior art solutions, the correction of D.C. offset is based on a corrupted signal and possibly some advance information of the useful signal, but the source of the interference is not taken into account in the correction.

SUMMARY OF THE INVENTION

It is an object of the present invention to eliminate the above drawbacks and to achieve a method and a device for eliminating D.C. offset and gaining AM suppression particularly in direct conversion receivers. The invention is based on the idea that a correction signal is derived from the signal powers of the reception channels used, and the correction signal is added to the signals demodulated from the signals of the received channel. Thus the signals received from the output of the summers correspond to the original, desired signals as well as possible. The method according to the invention is characterized in that a correction signal ($Q_{control}$) is produced from the signals ($R(t)$) of the channels of the reception frequency band, and in that the correction signal is combined with the demodulated signal. The apparatus according to the invention is characterized in that the apparatus comprises means for producing a correction signal, and means for combining the correction signal with the received and demodulated signal.

In a method according to the first preferred embodiment of the invention, the correction signal is produced directly from the received HF signal.

In the second preferred embodiment of the invention, the correction signal is produced from a downconverted and prefiltered signal.

The invention provides considerable advantages compared to the methods and devices known at present. In a direct conversion receiver implemented with the method according to the invention, the compensation of the D.C. offset and the AM suppression is performed in real time, whereby even momentary and quick changes in the D.C. offset can be eliminated as well as possible. In this invention, knowledge of the adjacent signals and the interference caused by them is used for producing the correction voltage. In the second preferred embodiment the D.C. signal of the reception channel does not have an effect on the correction signal.

BRIEF DESCRIPTION OF THE DRAWING

In the following, the invention will be described in more detail with reference to the appended drawings, in which.

DETAILED DESCRIPTION OF THE INVENTION

Figure 1:
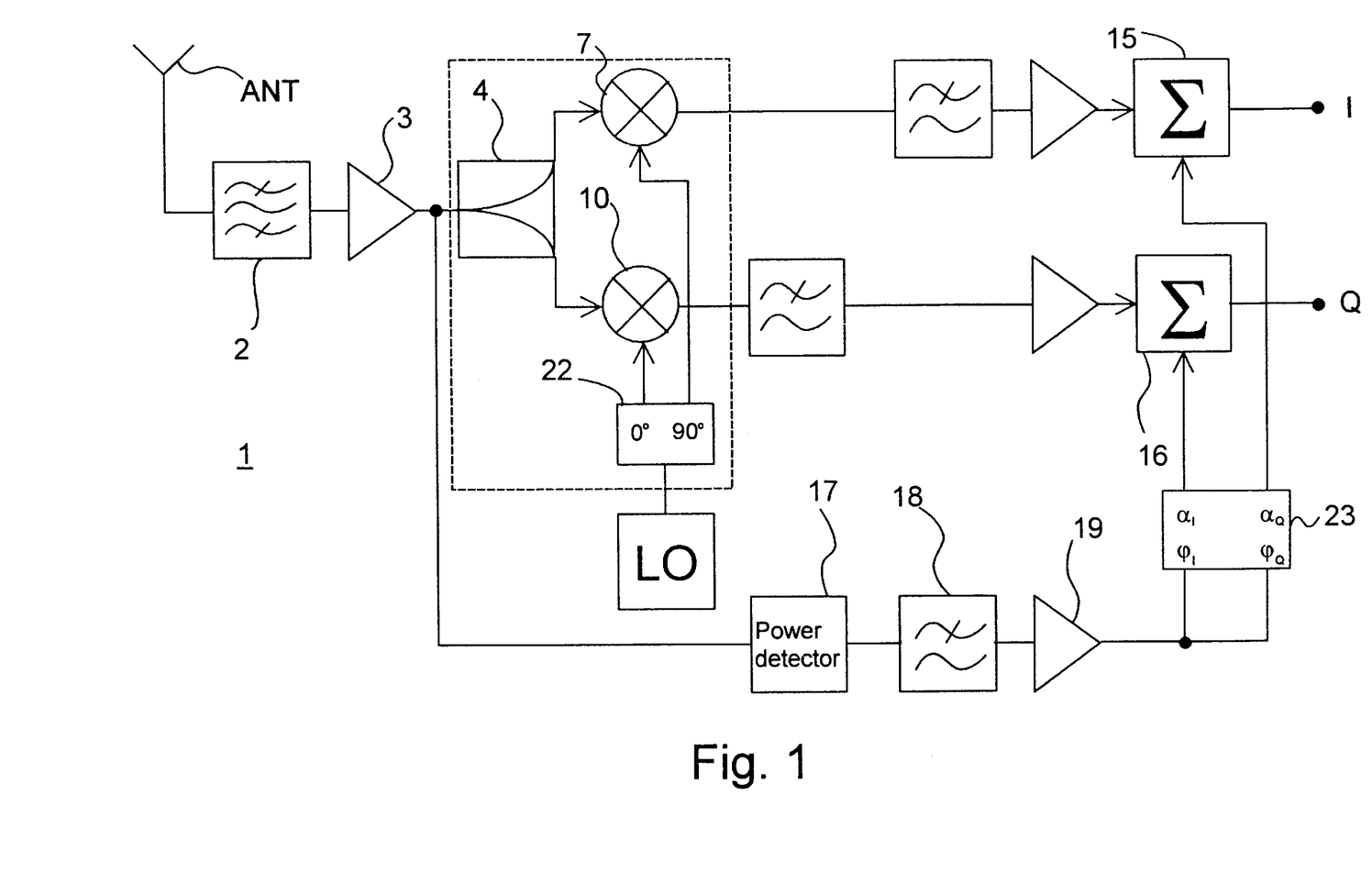
FIG. 1 shows a simplified block diagram of a receiver according to the first preferred embodiment of the invention, in which the correction voltage is produced from the signal powers of the entire radio frequency band of the invention.

FIG. 1 shows a method according to the first embodiment of the invention for compensating the D.C. offset and for achieving AM-attenuation in the receiver. A power detector 17 has been added to the receiver, and a signal from the output of the HF amplifier 3 is led to the signal port and local oscillator port of the detector. The output of the HF amplifier 3 thus includes the signals in the reception channel of the whole system, that is, both the signal in the actual reception branch and the signals in other channels of the system. The mixing results in the output port of the third mixer are low-pass filtered and amplified, whereby there is a correction signal in the output of the third low-frequency amplifier 19, and the correction signal is directed via an adapting device 23 to the summers 15, 16. The adapting device 23 adapts the amplitude and phase of the correction signal so that the compensation of the D.C. offset can be performed in the adders 15, 16 as well as possible. However, in addition to the power of the signals of the adjacent channels, the correction signal also includes the power of the actual useful reception signal, therefore it overcompensates the interfering D.C. offset by the correction signal.

Figure 2A:
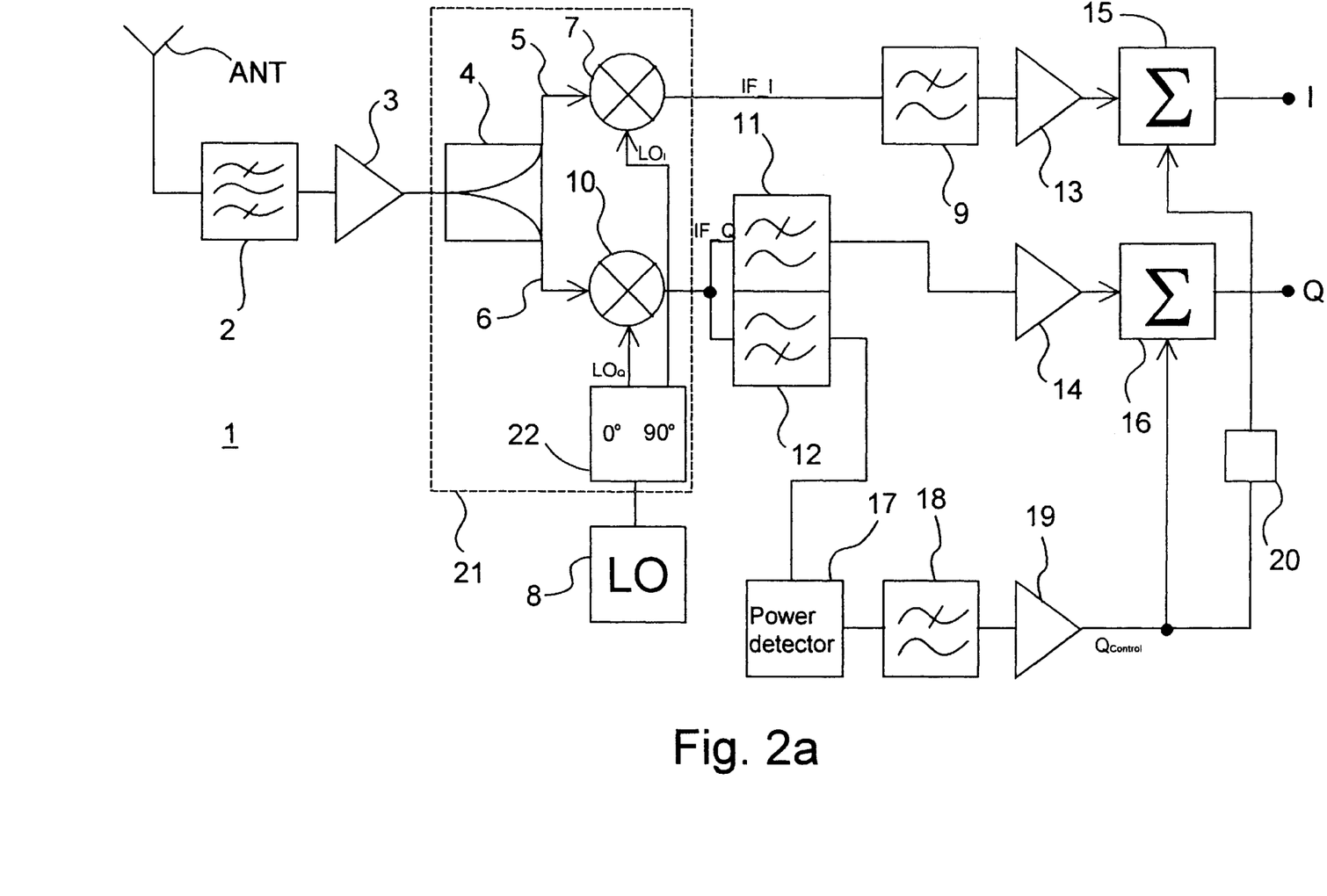
FIG. 2a shows a simplified block diagram of a receiver according to the second preferred embodiment of the invention, in which the correction voltage is produced from signal powers of the radio frequency spectrum of the system outside the received channel.
Figure 2B:
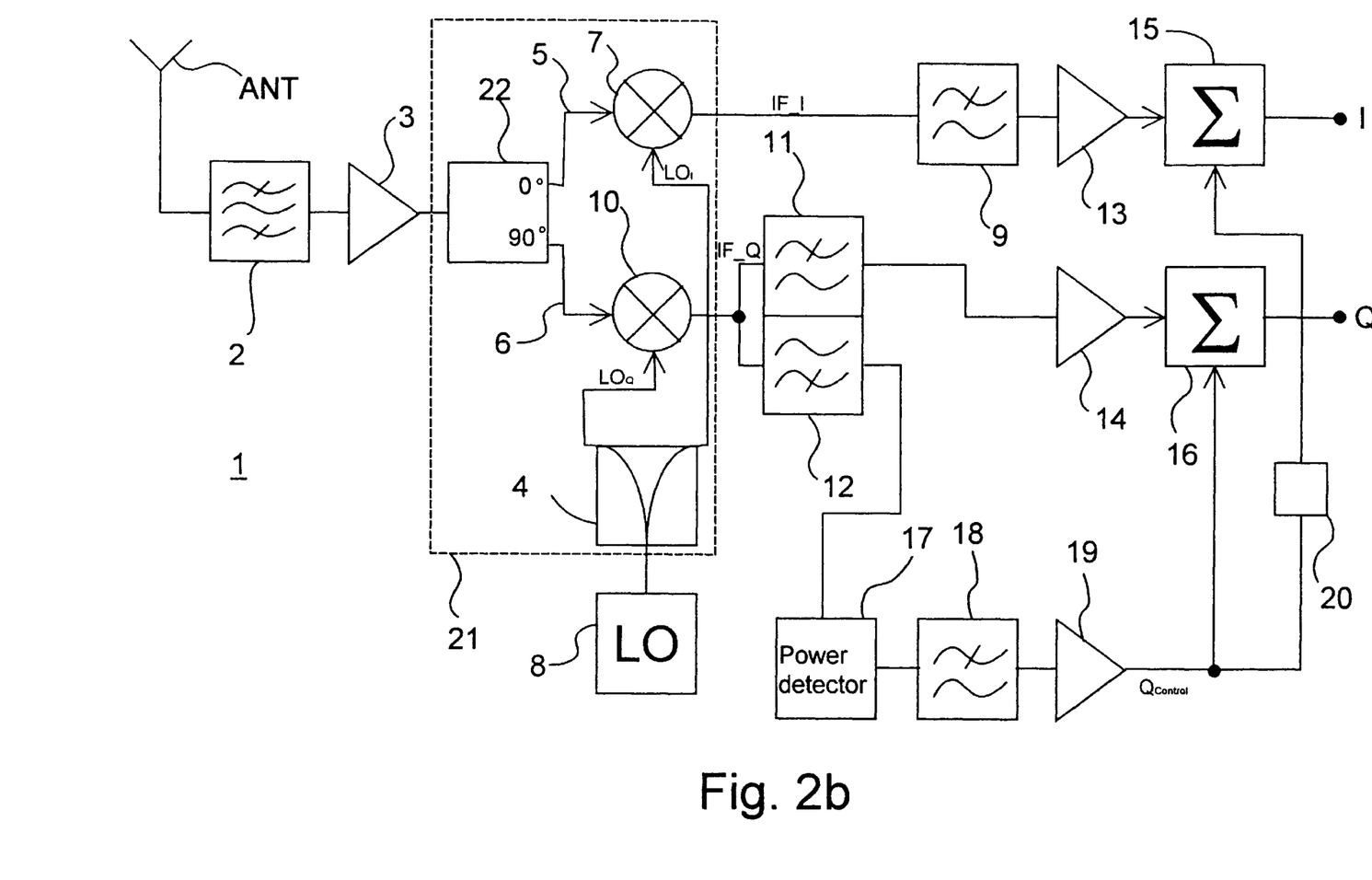
FIG. 2b shows an alternative construction of the I/Q demodulator as a simplified block diagram.
Figure 3:
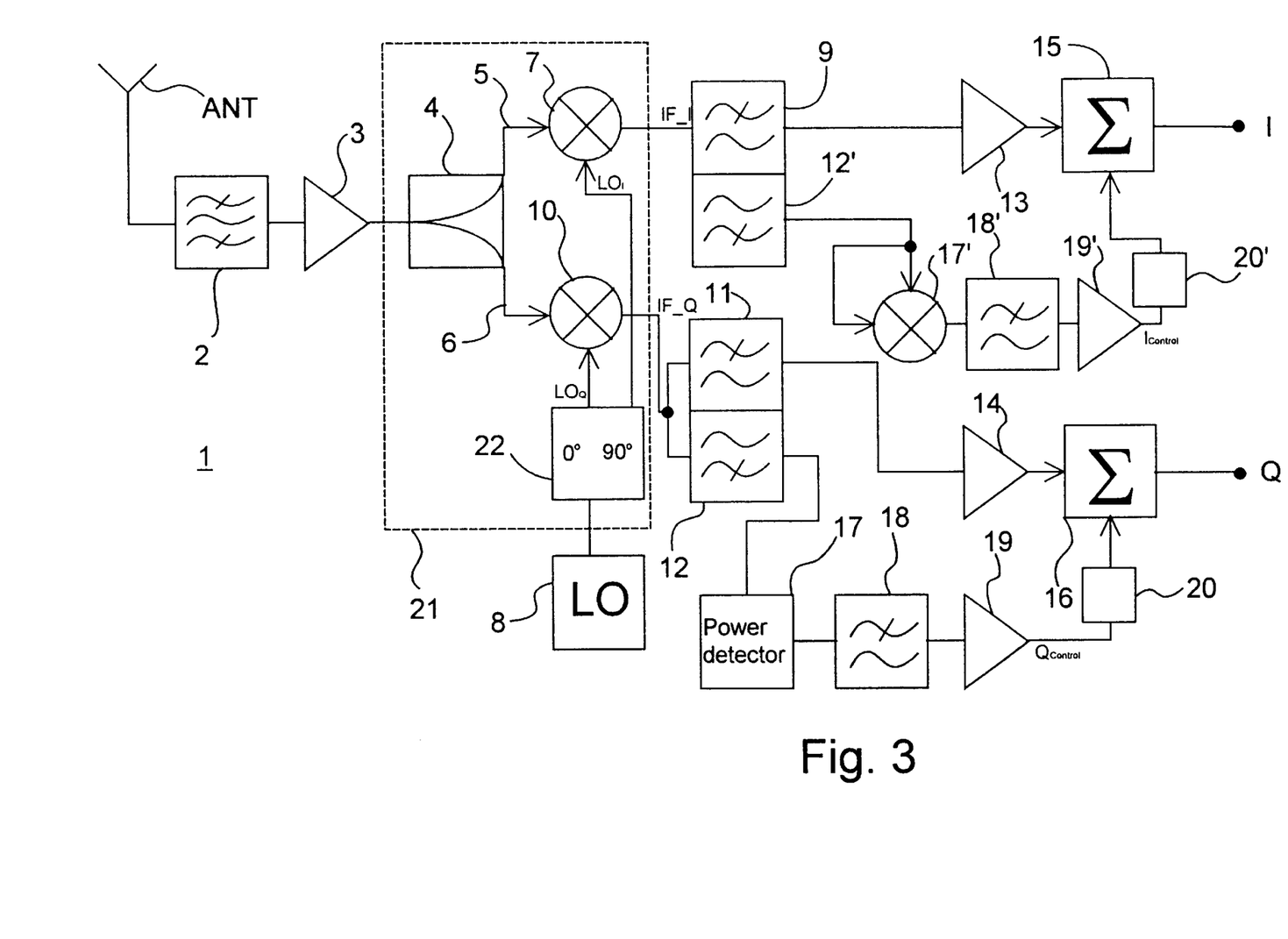
FIG. 3 shows a simplified block diagram of a receiver according to one preferred embodiment of the invention, in which a separate correction signal is produced for each demodulation branch.

In a receiver according to preferred embodiments of the invention shown in FIGS. 1–3, the received RF signal is directed via an antenna ANT to a passband filter 2, the passband of which comprises a reception frequency band of the radio communication system in which the receiver is intended to be used. In a GSM system, for example, the reception frequency band is 925 to 960 MHz, which is divided into channels of 200 kHz. In the PCN system, the reception frequency band is 1805 to 1880 MHz, divided into channels of 200 kHz.

From the passband filter, the filtered signal is directed to the HF amplifier 3. From the HF amplifier 3, the signal is further directed to the I/Q demodulator 21. The I/Q demodulator 21 comprises a power divider 4, a first and a second mixer 7, 10 and a phase shifter 22. The phase shifter 22 produces two local oscillator frequencies $LO_I/LO_Q$ from the local oscillator frequency produced by the local oscillator 8, whereby the local oscillator frequencies produced have a phase difference of 90°. The power divider 4 divides the coming RF signal into two essentially identical signals having the same phase.

From the first output line 5 of the power divider, the RF signal is directed to the first mixer 7, in which the local oscillator frequency $LO_I$ of the reception channel frequency, coming from the first output line of the phase shifter 22 is mixed with the signal. The signal IF_I produced by the first mixer 7 is directed to the first low-pass filter 9, in which all other signals except the baseband I signal (in-phase) received is filtered away from the signal.

A signal coming from the second output line 6 of the power divider 4 is taken to the second mixer 10, in which a local oscillator frequency $LO_Q$, coming from the second output line of the phase shifter 22 at the reception channel frequency, which has a 90° phase offset compared to the local oscillator frequency $LO_I$ to be directed to the first mixer 7, is mixed with the signal. The mixing result IF_Q is directed to the second low-pass filter 11 and the high-pass filter 12. The second low-pass filter 11 eliminates all other signals from the mixing result except the received, baseband frequency Q-signal (Quadrature phase).

The I/Q demodulator 21 can also be implemented by changing the places of the power divider 4 and the phase shifter 22 as shown in FIG. 2b, whereby the phase shifter 22 produces two identical signals with 90° phase difference from the radio frequency signal coming from the high-frequency amplifier 3. Correspondingly, the power divider 4 uses the local oscillator frequency to produce two local oscillator frequencies $LO_I$, $LO_Q$, which are both at the same phase. Otherwise the operation is like in FIG. 2a. The alternative I/Q demodulator 21 shown in FIG. 2b can also be applied in the receivers shown in FIGS. 1 and 3.

The baseband I and Q signals, which at this stage also include the D.C. offset caused by the signals in the adjacent channels, are amplified in the low-frequency amplifiers 13, 14 and directed to the adders 15, 16. Here they are converted with the help of output signal of amplifier 19 derived from the power detector 17.

The high-pass filter 12 removes the received, baseband signal from the signal produced by the second mixer 10. The high-pass filtered signal is directed to a power detector 17, which provides, the total power of the signals in the adjacent channels. The signal produced by the power detector 17 is low-pass filtered in the third low-pass filter 18 and amplified in the third low-frequency amplifier 19. The third low-pass filter 18 eliminates all other signals except the baseband part from the signal produced by the power detector 17.

The power detector 17 can consist of a mixer, for example, or it can be a simple diode power detector.

The output signal of the third low-frequency amplifier 19 is used as the correction signal in the adders 15, 16. An AM-attenuated I-signal is thus obtained from the output of the first adder 15, in which signal the D.C. offset has been compensated. Correspondingly, an AM-attenuated Q-signal is obtained from the output of the second adder 16, from which signal the D.C. offset has been compensated. The amplification of the small-signal amplifier 19 has been set so as to achieve maximum compensation of the D.C. offset.

The mixers 7, 10 shown in the coupling of FIG. 2a are assumed to be identical, whereby the same correction signal can be used in both adders 15, 16. The correction signal has been formed from the signal produced by the second mixer 10, but the correction signal can also be formed from the signal produced by the first mixer 7. If the mixers 7, 10 are not identical, the correction signal can be formed for the first adder 15 from the signal produced by the first mixer 7 by a correction circuit 12', 17', 18', 19', which is identical with the correction circuit 12, 17, 18, 19 shown in FIG. 2a, as shown in FIG. 3.

In practical applications some of the blocks shown in the couplings of FIGS. 1–3 can also be implemented as digital, whereby the analog signal is converted into digital by an A/D converter. For the sake of clarity, the A/D converters are not shown in the figures, because their location depends on the implementation used in each case.

Figure 4A:
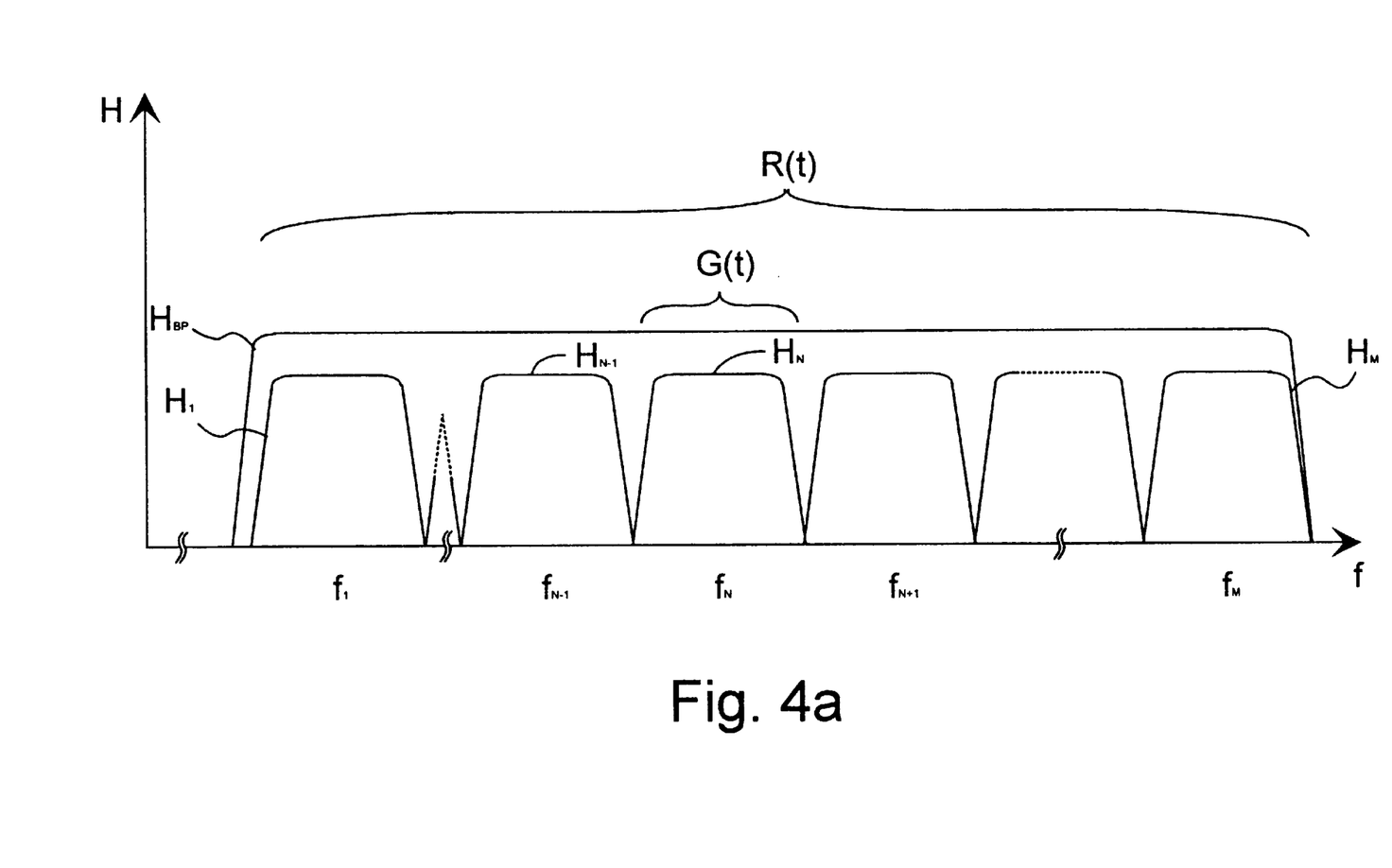
FIG. 4a shows a simplified diagram of the frequency spectrum of the reception frequency band of the radio communication system.

In the following, the operation of a method according to the invention is shown by way of calculation with reference to the coupling shown in FIG. 2a and to FIGS. 4a and 4b. The signal coming to the high-frequency amplifier 3 of the receiver 1 can be divided into two components:

$$R(t) = G(t) + I(t), \quad (1)$$

in which G(t) is the desired signal in the reception channel N, and I(t) includes the sum of the signals of all the channels 1–(N–1), (N+1)–M in the passband area of the passband filter 2. In FIG. 4a the passband area of the passband filter 2 is represented by the curve $H_{BP}$, and the curves $H_1, \ldots, H_M$ represent the channels 1, 2, . . . , M of the reception frequency band.

Figure 4B:
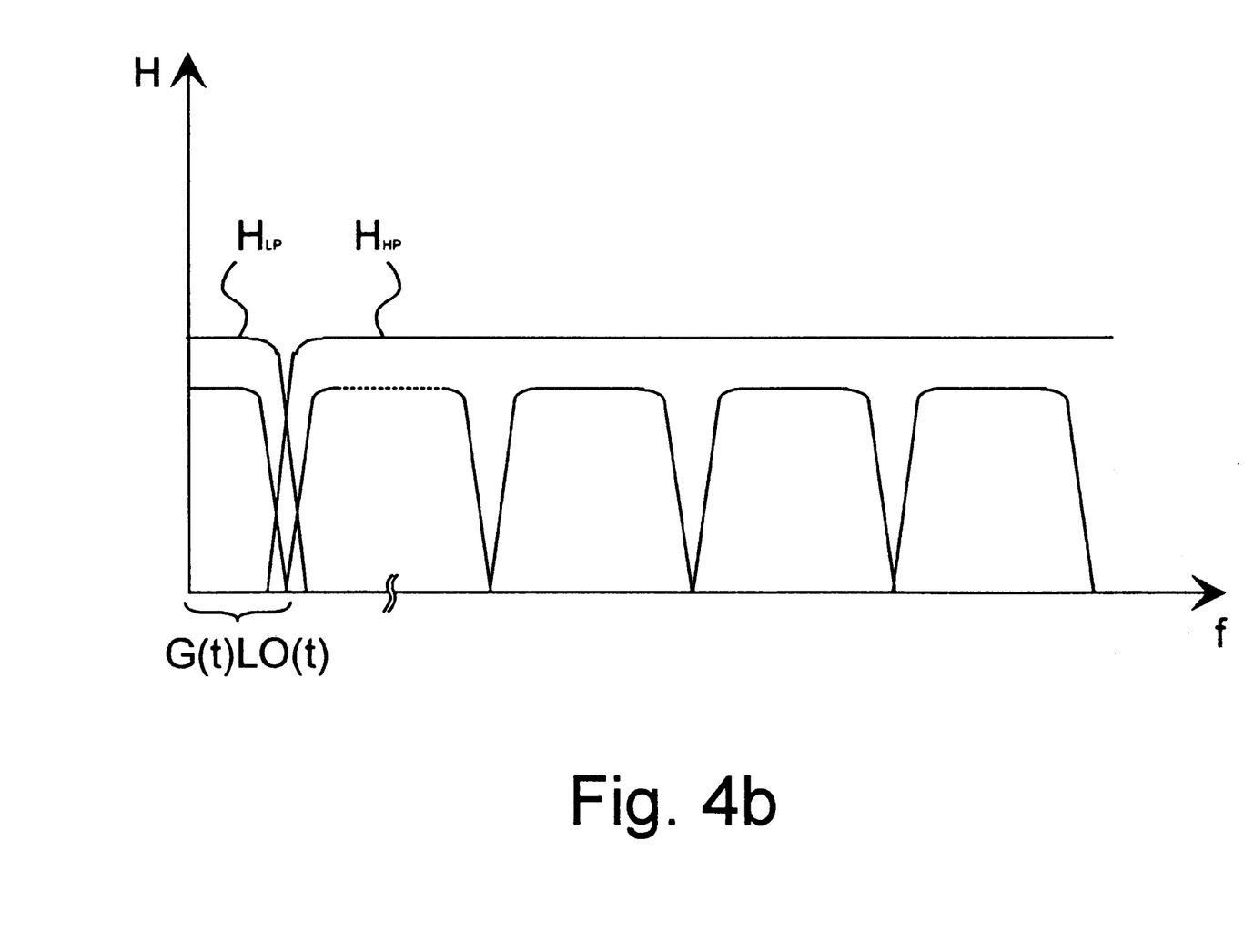
FIG. 4b shows a simplified diagram of the frequency spectrum of the output port of the I/C demodulator.

FIG. 4b shows a simplified frequency spectrum at the output port of the mixer 7, 10. Then the signal of the reception channel is at the baseband frequency, and the signals of the adjacent channels are at a higher frequency band. A curve $H_{LP}$, which depicts the frequency response of low-pass filtering and a curve $H_{HP}$, which depicts the frequency response of high-pass filtering are shown in FIG. 4b.

Because the isolation $\epsilon$ between the signal and local oscillator port of the mixer is not infinite, the signal R(t) coming to the signal port of the mixer is seen as attenuated also in the local oscillator port of the mixer, where it is superposed to the local oscillator signal LO(t). The local oscillator port of the mixer then, in fact, has the signal $$L(t) = LO(t) + \epsilon[G(t) + I(t)]. \quad (2)$$

Then the output port of the mixer has the mixing results $$IF(t) = [G(t) + I(t)] * [LO(t) + \epsilon[G(t) + I(t)]] = G(t)LO(t) + I(t)LO(t) + \epsilon[G^2(t) + I^2(t) + 2G(t)I(t)], \quad (3)$$

where

G(t)LO(t)=the desired baseband signal,

I(t)LO(t)=all other channels of the system at a low intermediate frequency, $\epsilon[G^2(t) + I^2(t)]$=dynamic D.C. offset, and $\epsilon[2G(t)I(t)]$=intermodulation products.

The second term I(t)LO(t) of the formula (3), which represents the signals of the adjacent channels, is removed by low-pass filtering. The third term $\epsilon[G^2(t) + I^2(t)]$ represents the interfering D.C. offset, which varies with the power variations of the adjacent signals. The last term $\epsilon[2G(t)I(t)]$ represents the intermodulation products between the desired signal and the signals of the adjacent channels.

In practice, the intermodulation products $\epsilon[2G(t)I(t)]$ can be ignored. In connection with the formula (1) it was defined that G(t) is the desired signal which has a frequency between $0 < f_G < f_{BB}$, and I(t) is limited between $f_{BB} < f_I < f_{RF}$, where $f_{RF}$ is the width of the reception frequency band of the system. It is assumed that the mixer is sufficiently linear, whereby no considerable second and third order terms $I^2(t)$, $I^3(t)$ are produced, whereby only the intermodulation results of signals in the frequency band $f_{BB} < f_I < 2f_{BB}$ have an effect in the desired baseband frequency area. In an ideal filter, the edge of the passband is vertical, whereby signals outside the passband do not get through the filter. In practical applications, however, it is not possible to make the edge of the passband completely vertical, whereby part of the signals outside the passband get through the filter. In this case, the power of the channels adjacent to the received channel must be limited in order to eliminate the intermodulation results. When applied in a GSM system, it has been found that with the mixer port isolation value $\epsilon < -24$ dB the last term of the formula (3) has no effect.

The frequency spectrum of the dynamic D.C. offset of the correction channel also includes the power contained in the desired signal, but multiplied by the port isolation $\epsilon$, which is very small, and thus it causes only a very small error in the desired signal regardless of the intensities of the signals I(t) and G(t). If disturbing coupling only occurs within the mixer, it can be assumed that the attenuation coefficient $\epsilon$ is real. In practical applications, however, coupling also occurs between microstrips and external components, whereby the attenuation coefficient $\epsilon$ is complex and causes some phase offset between the dynamic, interfering D.C. offset and the correction signal amplified in the correction channel. In this case, the phase offset must be tuned before the correction signal is summed to the demodulated signals. This is shown in FIG. 3, in which phase offset devices 20, 20' have been added to the demodulation branches.

As has been stated earlier in connection with the description, one correction channel is sufficient to produce a correction signal for both the I and Q signals, if the mixers 7, 10 are identical. This can be proved as follows. The frequency spectrum of the correction signal is low-pass filtered, whereby only the signals $|\omega_{Aj} - \omega_{Ai}| < \omega_{BB}$ have an effect on the production of the correction signal, but these difference terms do not include the phase offset of the local oscillator frequencies. Ai and Aj represent channels that are in the reception frequency band. This can be easily proved mathematically by two sine waves $A_1$, $\omega_{A1}$ and $A_2$, $\omega_{A2}$, which depict the amplitudes and frequencies of the adjacent channels, multiplied by the third sine wave $\omega_C$, which represents the local oscillator frequency LO. The formula is:

Channel I $$IF\_I = \cos\omega_c t(A_1\cos\omega_{A1}t + A_2\cos\omega_{A2}t) \quad (4)$$

$$= 1/2 A_1[\cos(\omega_c - \omega_{A1})t + \cos(\omega_c + \omega_{A1})t] +$$

$$1/2 A_2[\cos(\omega_c - \omega_{A2})t + \cos(\omega_c + \omega_{A2})t]$$

The summed terms $\omega_C + \omega_{A1}$ and $\omega_C + \omega_{A2}$ have such a high frequency that they are eliminated. The remaining terms are squared, whereby:

$$(IF\_I)^2 = 1/4 A_1^2\cos^2(\omega_c - \omega_{A1})t + 1/4 A_2^2\cos^2(\omega_C - \omega_{A2})t + \quad (5)$$

$$1/2 A_1 A_2[\cos[\omega_c - \omega_{A1}]t * \cos(\omega_c - \omega_{A2})t]$$

$$= 1/8 A_1^2[1 + \cos 2(\omega_C - \omega_{A1})t] +$$

$$1/8 A_2^2[1 + \cos 2(\omega_C - \omega_{A2})t] +$$

$$1/4 A_1 A_2[\cos(\omega_{A2} - \omega_{A1})t + \cos(2\omega_C - \omega_{A1} - \omega_{A2})t]$$

The signals $\omega_{A1}$ and $\omega_{A2}$ represent the channels adjacent to the received channel, whereby $|\omega_C - \omega_{A1}| > \omega_{BB}$, $|\omega_C - \omega_{A2}| > \omega_{BB}$ and $|2\omega_C - \omega_{A1} - \omega_{A2}| > \omega_{BB}$, where $\omega_{BB}$ is the bandwidth of the baseband frequency band. After the low-pass filtering, the correction signal obtained from the I-branch is:

$$I_{control} = \tfrac{1}{8}A_1^2 + \tfrac{1}{8}A_2^2 + \tfrac{1}{4}A_1A_2 \cos(\omega_{A2} - \omega_{A1})t \qquad (6)$$

Channel Q $$\begin{aligned}
IF\_Q &= \sin\omega_C t(A_1\cos\omega_{A1}t + A_2\cos\omega_{A2}t) \qquad (7)\\
&= 1/2 A_1[\sin(\omega_C - \omega_{A1})t + \sin(\omega_C + \omega_{A1})t +\\
&\quad 1/2 A_2[\sin(\omega_C - \omega_{A2})t +\\
&\quad \sin(\omega_C + \omega_{A2})t]
\end{aligned}$$

Similarly, like above in the formulas (4) and (5), the formula (7) is squared as follows:

$$\begin{aligned}
(IF\_Q)^2 &= 1/4 A_1^2 \sin^2(\omega_C - \omega_{A1})t + 1/4 A_2^2 \cos^2(\omega_C - \omega_{A2})t + \qquad (8)\\
&\quad 1/2 A_1 A_2 (\sin(\omega_C - \omega_{A1})t * \sin(\omega_C - \omega_{A2})t]\\
&= 1/8 A_1^2 [1 - \cos 2(\omega_C - \omega_{A1})t] +\\
&\quad 1/8 A_2^2 [1 - \cos 2(\omega_C - \omega_{A2})t] +\\
&\quad 1/4 A_1 A_2 [\cos(\omega_{A2} - \omega_{A1})t -\\
&\quad \cos(2\omega_C - \omega_{A1} - \omega_{A2})t]
\end{aligned}$$

Further, considered that $\omega_{A1}$ and $\omega_{A2}$ represent the channels adjacent to the received channel, after the low-pass filtering the correction signal obtained from the Q-branch is:

$$Q_{control} = \tfrac{1}{8}A_1^2 + \tfrac{1}{8}A_2^2 + \tfrac{1}{4}A_1A_2 \cos(\omega_{A2} - \omega_{A1})t \qquad (9)$$

The phase offset of local oscillator frequencies $LO_i$, $LO_Q$ occurs only in terms which include $\omega_C$, but these terms are always outside the baseband frequency band $\omega_{BB}$ and are removed in low-pass filtering.

It can be seen from the above that the correction signals $I_{control}$ and $Q_{control}$ are the same, and so in this case the same signal can be used as the correction signal for both demodulation branches.

The correction channel includes information of the signal power in other channels. Particularly in a cellular mobile phone system, if the channels adjacent to the received channel contain a much stronger signal, it can be assumed that a stronger base station is available. Then the correction signal can also be used to assist in determining the need to change to another channel.

Although the invention has above been described as applied to a direct conversion receiver in which an I/Q demodulator is used, the method according to the invention can also be applied in other types of direct conversion receivers.

What is claimed is:

1. A method for compensating the D.C. offset and for obtaining spurious AM suppression from a signal (IF_I, IF_Q) received and demodulated in a channel of a reception frequency band in a radio communication system in a direct conversion receiver, comprising steps of:
   detecting power of a signal received in a channel at the reception frequency band;
   producing a correction signal ($Q_{control}$) from the signals (R(t)) of the channels of the reception frequency band by use of said power; and
   combining the correction signal with the demodulated signal.

2. A method according to claim 1, characterized in that the signals of all channels (R(t)) of the reception frequency band are used to produce the correction signal.

3. A method for compensating the D.C. offset and for obtaining spurious AM suppression from a signal (IF I, IF Q) received and demodulated in a channel of a reception frequency band in a radio communication system in a direct conversion receiver; wherein
   a correction signal ($Q_{control}$) is produced from the signals (R(t)) of the channels of the reception frequency band, and the correction signal is combined with the demodulated signal; and
   the correction signal is produced from the signals of the channels (I(t)) of the reception frequency band outside the received channel.

4. A method according to claim 1, 2, characterized in that the power of the signals of the reception frequency band is used to produce the correction signal.

5. A method according to claim 1, characterized in that the correction signal is summed to the received and demodulated signal.

6. A method according to claim 1, characterized in that the received and demodulated signal is a signal of a digital radio communication system.

7. A method according to claim 1, characterized in that the received and demodulated signal is an I/Q-modulated signal.

8. A method according to claim 1, characterized in that the direct conversion receiver is a GSM receiver, and the reception frequency band is a reception frequency band of the GSM system.

9. A method for compensating the D.C. offset and for obtaining spurious AM suppression from a signal (IF I, IF Q) received and demodulated in a channel of a reception frequency band in a radio communication system in a direct conversion receiver; wherein
   a correction signal ($Q_{control}$) is produced from the signals (R(t)) of the channels of the reception frequency band, and the correction signal is combined with the demodulated signal; and
   the direct conversion receiver is a PCN receiver and the reception frequency band is a reception frequency band of the PCN system.

10. An apparatus for compensating the D.C. offset from the received and demodulated signal in a direct conversion receiver (1), which includes means for receiving and demodulating signals in the reception frequency band, characterized in that the apparatus also comprises:
    means (12, 17, 18, 19) for producing a correction signal, and
    means (15, 16) for combining the correction signal with the received and demodulated signal.

11. An apparatus according to claim 10, characterized in that the means (12, 17, 18, 19) for producing a correction signal comprise a high-pass filter, a power detector (17), a third low-pass filter (18), and a third low-frequency amplifier (19), and that the means (15, 16) for combining the correction signal with the demodulated signal comprise at least one adder (15, 16).

12. An apparatus according to claim 10, characterized in that the apparatus also comprises at least one AID converter, whereby the correction signal is produced at least partly digitally.

13. An apparatus according to claim 10, characterized in that the direct conversion receiver (1) is a GSM receiver.

14. An apparatus according to claim 10, characterized in that the direct conversion receiver (1) is a PCN receiver.

15. A method for compensating the D.C. offset and for obtaining spurious AM suppression from a signal (IF_I, IF_Q) received and demodulated in a channel of a reception frequency band in a radio communication system in a direct conversion receiver, characterized in that a correction signal ($Q_{control}$) is produced from the signals (R(t)) of the channels of the reception frequency band, and the correction signal is combined with the demodulated signal.

* * * * *